United States Patent [19]

Krueger

[11] Patent Number: 5,131,460
[45] Date of Patent: Jul. 21, 1992

[54] REDUCING PARTICULATES DURING SEMICONDUCTOR FABRICATION

[75] Inventor: Gordon P. Krueger, San Jose, Calif.

[73] Assignee: Applied Materials, Inc., Santa Clara, Calif.

[21] Appl. No.: 782,848

[22] Filed: Oct. 24, 1991

[51] Int. Cl.⁵ ............... F28F 7/00; H01L 21/58; C23C 14/22
[52] U.S. Cl. .............. 165/80.2; 165/80.3; 437/228; 437/248; 29/25.02; 118/50
[58] Field of Search .............. 165/80.2, 80.3; 437/228, 248; 29/25.02; 118/50

[56] References Cited

U.S. PATENT DOCUMENTS

| | | | |
|---|---|---|---|
| 4,508,161 | 4/1985 | Holden | 165/80.1 |
| 4,527,620 | 7/1985 | Pedersen et al. | 165/80.5 |
| 4,671,204 | 6/1987 | Ballou | 165/80.4 |
| 4,680,061 | 7/1987 | Lamont, Jr. | 427/38 |
| 4,724,621 | 2/1988 | Hobson et al. | 165/80.4 |

FOREIGN PATENT DOCUMENTS 210634 9/1986 Japan ............... 29/25.02

Primary Examiner—Martin P. Schwadron
Assistant Examiner—L. R. Leo
Attorney, Agent, or Firm—Claude A. S. Hamrick

[57] ABSTRACT

A system for pumping down pressurized gas residing after shut-off in the piping use to provide a gas flow to facilitate backside wafer heating/cooling during the processing of a semiconductor wafer and including a valve selectable secondary piping line for equalizing on shutoff any pressure differential occurring in the primary gas flow line between the process chamber and the backside heating element. The secondary line runs from an opening in the process chamber wall to a tee-joint installed in the primary flow line immediately downstream of the final isolation valve in the primary line. A valve is installed in the secondary line and is operationally interlocked, in an inverse manner, with the isolation valve in the primary line such that when one valve is open the other valve is closed and vice versa.

4 Claims, 3 Drawing Sheets

REDUCING PARTICULATES DURING SEMICONDUCTOR FABRICATION

BACKGROUND OF THE INVENTION

1. Field of the Invention

The present invention relates generally to semiconductor fabrication methods and apparatus, and more particularly to a method and apparatus for reducing particulates deposited on semiconductor substrates during fabrication.

2. Description of the Prior Art

Semiconductor devices are commonly manufactured by sequentially performing a number of process steps to an exposed surface of a semiconductor substrate. The process steps typically include implanting dopant ions in the semiconductor material immediately below the exposed surface, depositing films on the exposed surface by processes such as chemical vapor deposition and sputtering, and etching selected portions of the substrate and deposited films. Such processes generally are performed inside air-tight chambers operating at interior gas pressures below atmospheric pressure.

A continuing problem in developing and using semiconductor fabrication processes is to prevent spurious particulates from being deposited on the semiconductor devices. This problem is especially difficult to address because it is difficult to detect the presence of particulates only a few microns in diameter, and even more difficult to determine the source or cause of the particulates. Of course, there are many different sources contributing to particulates in semiconductor fabrication. As each source is discovered, a solution can be developed to reduce or eliminate the generation of particulates by that source, thereby contributing to an overall reduction in the contamination of semiconductor devices by spurious particulates.

SUMMARY OF THE PRESENT INVENTION

The present invention is a method and apparatus for substantially eliminating a newly discovered source of particulates in semiconductor fabrication processes.

The invention is applicable to semiconductor fabrication processes which are performed inside a vacuum chamber and which employ a heat exchanger for heating or cooling the semiconductor substrate. For example, sputtering systems and ion implantation systems generally include a heat exchanger to cool the substrate; etching and chemical vapor deposition systems generally include a heat exchanger to heat the substrate. Such processes often use a gas to fill the gap between the backside of the substrate and the heat exchanger to enhance heat transfer between them.

The invention is based on Applicant's discovery that a serious source of particulates in the semiconductor fabrication processes described above is the residual pressure differential between the two sides of the substrate when a process step is completed and the substrate is removed from the heat exchanger. Specifically, because the heating or cooling gas between the substrate and the heat exchanger generally is at a much higher pressure that the gas pressure in the vacuum chamber, a clamp must be used to hold the substrate against the heat exchanger. When the clamp is released after completion of a process step, the heating or cooling gas pushes the substrate away from the heat exchanger and rushes into the vacuum chamber. This causes the substrate to vibrate against—and repeatedly impact—the heat exchanger, the clamp, or both. This vibration and repeated impact can flake off material from the surfaces of the impacted objects, thereby producing unwanted particulates which can be deposited on the substrate.

The present invention overcomes this problem by adding a gas conduit providing a path for the heating or cooling gas to flow into the vacuum chamber while the substrate remains clamped to the heat exchanger. While a process step is being performed in the chamber, a valve in this conduit is operated in a closed condition so as to prevent the heating or cooling gas from flowing through the conduit into the chamber. When the process step is completed, the valve is opened to permit the heating or cooling gas to enter the chamber, thereby eliminating the pressure differential across the substrate. At this time, the clamp holding the substrate against the heat exchanger can be released, and there will be no rush of gas past the substrate to cause vibration and unwanted particulates.

IN THE DRAWINGS

DESCRIPTION OF THE PREFERRED EMBODIMENT

It is a common practice in the semiconductor processing industry to plate the surface of a semiconductor wafer with a metal or metal oxide using a sputtering technique wherein a wafer is disposed in an evacuated chamber and a metallic material is electrically removed from an anode and plated onto the wafer surface. A similar process may be used to sputter-etch the wafer surface using rf energy to heat the wafer.

It is further a common practice in the industry to heat or cool the backside surface of the wafer (the side not directly exposed to the anode) to facilitate deposition of the metallic material onto the upper side surface or control the temperature of the wafer during the etching operation. A common practice for accomplishing this backside heating or cooling is to place a heated or cooled plate beneath the wafer and to flow a gas over the surface of this plate and beneath the wafer to assist in the even heat transfer to or from the wafer. See, for example, the U.S. Pat. Nos. to Lamont, Jr. (4,743,570) and Cheng et al. (4,842,683).

Figure 1:
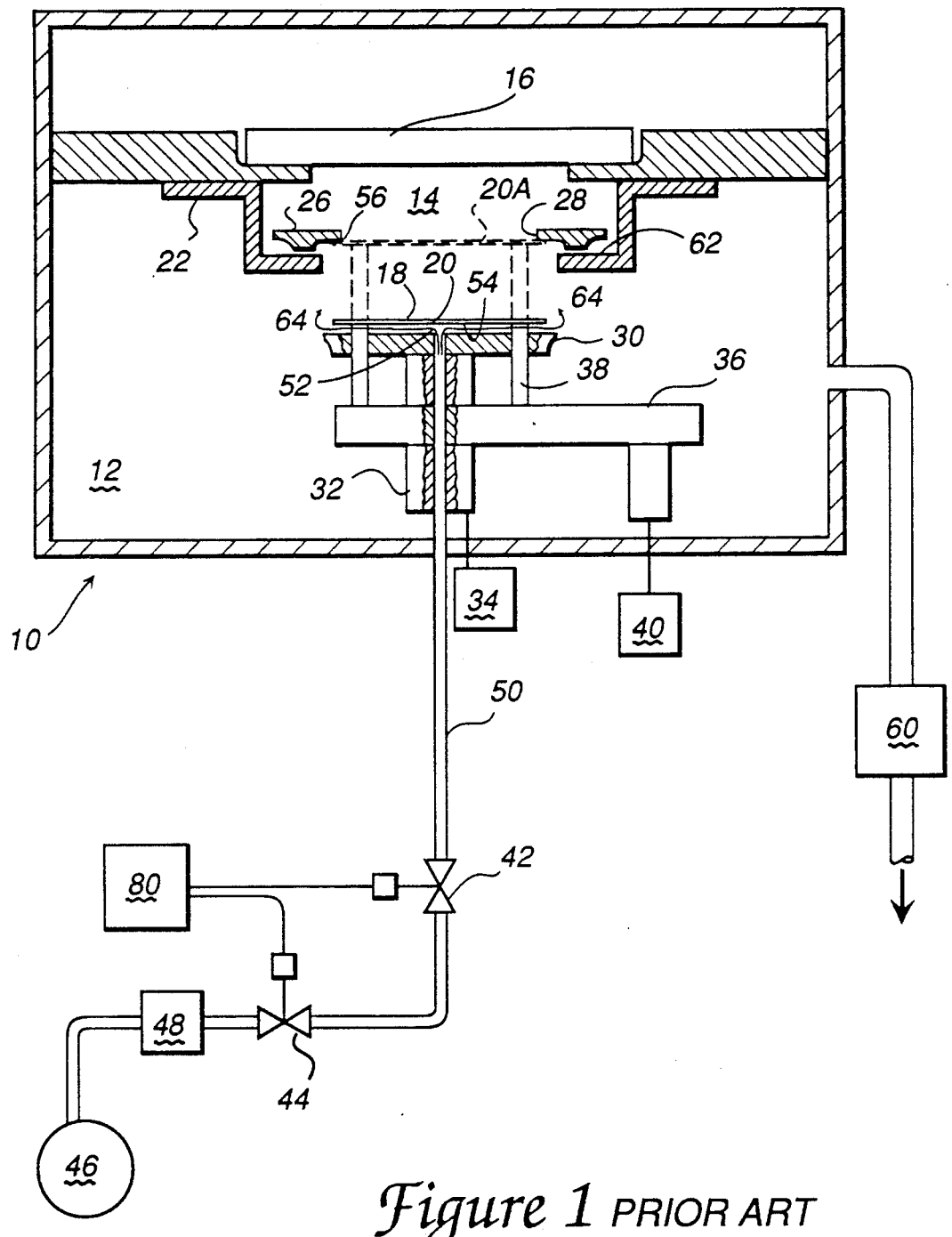
FIG. 1 depicts prior art apparatus for providing backside heating/cooling to a semiconductor wafer processing chamber.

In a typical prior art processing system schematically shown in FIG. 1, a housing 10 is depicted forming an evacuable processing chamber 12, the upper portion of which forms a sputtering region 14 wherein metal is sputtered from an anode plate 16 onto the upper surface 18 of a semiconductor wafer 20. The sputtering region 14 is defined by the anode plate 16, a cathode forming bowl 22 having a central opening 24 formed in the bottom thereof, and a wafer clamp 26 the inner periphery 28 of which defines a plating aperture or opening. The anode and cathode are electrically interconnected in a manner well known in the art.

Disposed within the chamber 12 beneath the clamp 26, the bowl 22, and the wafer 20 is a wafer heating plate 30 and a heating plate lift assembly 32. The heating plate 30 is moved between a lower position and an upper position by the lift assembly 32 which in turn is positioned by an actuator 34. Disposed beneath the wafer 20 is the wafer lift assembly 36 including a number of upstanding wafer-engaging fingers 38. The wafer 20 is moved between a lower position, as shown by the solid lines, and an upper position 20A by the lift assembly 36 which in turn is positioned by actuator 40.

In preparation for the sputtering process wafer 20 is elevated into the upper position 20A by the lift assembly 32 and is compressed against clamp 26. Isolation valves 42 and 44 are opened and gas is caused to flow from a reservoir 46 through a mass flow controller 48, the valves 42 and 44, a section of piping 50, the heating or cooling plate 30, and an orifice 52 onto the wafer backside surface 54 of wafer 20. The gas is heated or cooled as it flows through and over the surface of the plate 30 and serves to transfer heat to or from the wafer backside surface 54.

After the sputtering process is completed, the heating/cooling plate lifting assembly 32 lowers and hands the wafer 20 off to the wafer lifting assembly 36. The wafer lifting assembly 36 lowers the wafer from the upper position 20A and away from the clamp 26, to the lower position 20.

More specifically, as the sputtering process is completed, valves 42 and 44 are closed, thereby terminating the flow of heating gas from the reservoir 46. Simultaneously, the process gas flow into the chamber 16 is also terminated, but the chamber continues to be evacuated by a vacuum source 60. However, for a brief period of time after the controlled flow of heating gas is interrupted, the piping 50 downstream of valve 42 (i.e. upstream of the wafer backside) remains partially pressurized and, for a few seconds, the wafer continues to be exposed to the gas flow emanating from the pressurized piping 50 as it purges itself. During this time the wafer backside surface 54 may be subjected to a pressure significantly higher (typically 8 mTorr) than is the upper side surface (typically, $1 \times 10^{-7}$ Torr). Since the wafer 20 is no longer restrained by the clamp 26, it may be vibrated on its support 38, and in some cases may be lifted with sufficient force to strike against the clamp 26. In either case, this wafer vibration may cause particles to flake off the wafer or other surfaces within the chamber. If such particles settle onto the wafer surface, they will result in contamination of the wafer.

Figure 2:
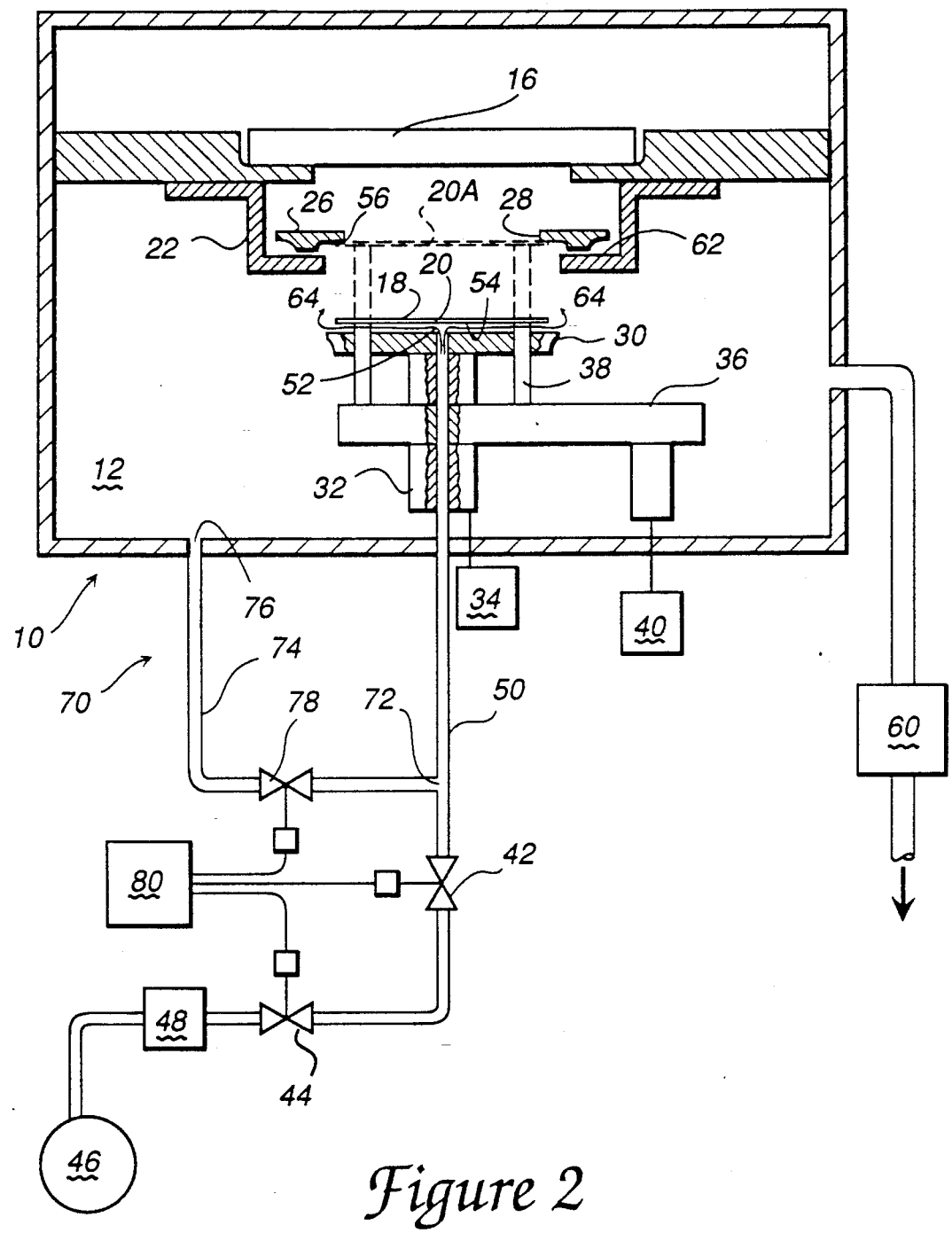
FIG. 2 illustrates a semiconductor wafer processing chamber including gas line equalization piping in accordance with the present invention.

Referring now to FIG. 2 of the drawing, a solution to this problem implemented in a preferred embodiment of the present invention is schematically shown in apparatus adapted to sputter a metal coating onto or etch material from the surface of a semiconductor wafer. In such an embodiment a housing 10 is depicted forming an evacuable processing chamber 12, the upper portion of which forms a sputtering region 14 wherein metal is sputtered from an anode plate 16 onto the upper surface 18 of a semiconductor wafer 20. As suggested above, the processing chamber may alternatively be configured to etch the wafer 20. The sputtering region 14 is defined by the anode plate 16, a cathode forming bowl 22 having a central opening 24 formed in the bottom thereof, and a wafer clamp ring 26 the inner periphery 28 of which defines a plating aperture or opening. The anode and cathode are electrically interconnected in a manner well known in the art.

Disposed within the chamber 12 beneath the clamp ring 26, the bowl 22, and the wafer 20 is a wafer heating/cooling plate 30 and an associated lift assembly 32. The heating/cooling plate 30 is moved between a lower position and an upper position by the lift assembly 32 by an actuator 34. Disposed beneath the wafer 20 is a wafer lift assembly 36 including a number of upstanding wafer-engaging fingers 38. The wafer 20 is moved between a lower position, as shown by the solid lines, and an upper position 20A by the lift assembly 36 which in turn is driven by actuator 40.

Although not shown in detail, as is well-known in the prior art, the heating/cooling plate 30 may be provided with suitable heating elements and/or passageways through which a coolant fluid may be passed.

The backside heating/cooling piping system is comprised of a gas reservoir 46, a pair of isolation valves 42 and 44, a mass flow controller 48, and a section of piping 50 running through an opening in the process chamber wall, through an orifice 52 in the heating/cooling plate 30, and onto the wafer backside surface 54. The gas is heated/cooled as it flows through and over the surface of the heating plate 30 and serves to transfer heat to or from the wafer backside surface 54.

The secondary piping/equalization line assembly 70 is coupled to the piping 50 by means of a tee-joint 72 installed immediately downstream of the final isolation valve 42. The equalization line 74 is routed to an opening 76 in the wall of process chamber 12. A valve 78 is installed in the line 74 and is operationally interlocked with the other valves 42 and 44 in the primary line through a controller 80.

In operation, in preparation for the sputtering process, the wafer 20 is elevated to the upper position 20A by the lift assembly 32. The process gas is introduced into chamber 12 (not shown in FIG. 2) and the chamber is simultaneously evacuated by the vacuum source 60.

During the sputtering process, a flow of backside heating/cooling gas such as argon is used to facilitate the deposition or etching operation that is occurring on the upper side 18 of the wafer. The valves 42 and 44 are open and gas flows from the reservoir 46 through the mass flow controller 48, through the section of primary gas line 50, through the heating/cooling plate 30, and out of the orifice 52 onto the wafer backside surface 54. The gas is heated/cooled as it flows through and over the surface of the heating plate 30 and serves to transfer heat to the wafer backside surface 54. Since the valves 42 and 44, and 78 are inversely interlocked, valve 78 is closed and there is no gas flow through the secondary line 74.

After the sputtering process is completed, the controlled flow of process gas to the chamber 16 is shut off as valves 42 and 44 are closed. Simultaneously, valve 78 is opened to dump any remaining pressurized gas in the piping 50 downstream of valve 42 (i.e. upstream of the wafer backside) into the chamber 12 through opening 76. Thus, the gas flow to the backside of wafer 18 is immediately terminated so that wafer backside surface 54 is not exposed to pressures significantly higher than those acting on the upper side surface. Consequently, the wafer does not vibrate and is not lifted from its support 38. Also, the pressurized gas does not blow by the wafer's edges 64 and cause loose particles to be deposited onto the wafer upper side resulting in surface contamination problems.

Figures 3, 3A:
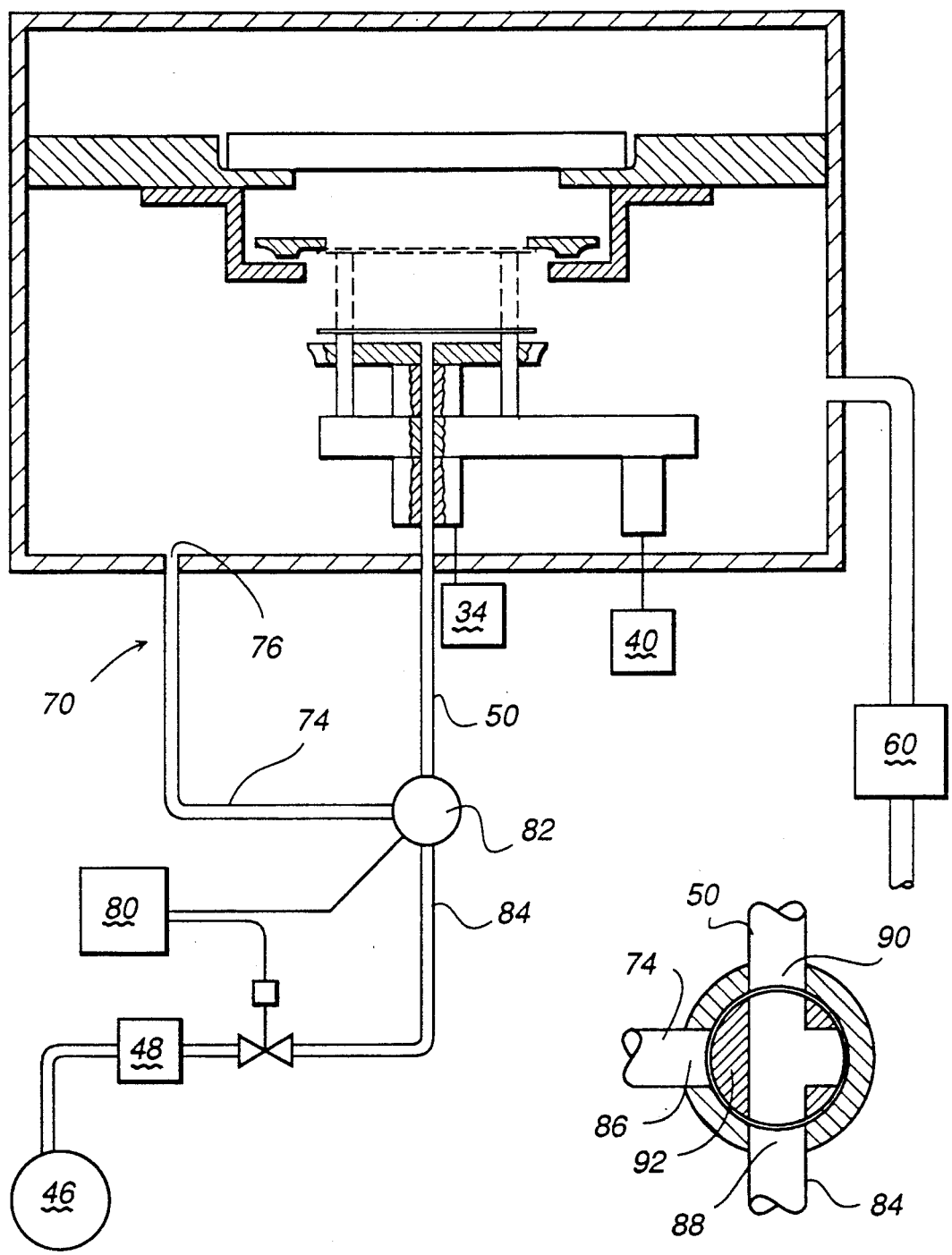
FIG. 3 illustrates an alternate embodiment of the present invention.
FIG. 3A depicts a cross-sectional view of the valve used in the alternate embodiment depicted in FIG. 3.

Referring now to FIG. 3, it will be appreciated that as an alternative to the final isolation valve 42 and the equalization line valve 78 a single two-way valve 82 may be utilized. The two-way valve 82 has three ports or openings 86, 88, and 90 and a rotatable cock 92 which in one position couples port 88 to port 90, and in another position couples port 86 to port 90.

In operation, while the sputtering process is occurring, the valve is in the configuration shown in FIG. 3A. That is, cock 92 is aligned to connect piping 50 with piping 84. In this alignment, gas flows through the valve to the heater plate with no gas flowing through piping 74. After the sputtering process is complete, the valve cock is rotated 90 degrees counterclockwise such that piping 84 is isolated, and piping 74 is coupled to piping 50. In this configuration, the residual pressure in the piping 50 downstream of the valve is dumped into the process chamber through piping 74. Thus, the wafer is no longer subjected to gas flow emanating from the piping 50. During this time the wafer backside surface is not exposed to pressures significantly higher than those acting on the upper side surface. Consequently, the wafer does not vibrate, nor does it lift from its support and perhaps strike the clamp ring. Also, the pressurized gas does not blow by the wafer's edges and lead to the transfer of loose particles onto the wafer upper side causing surface contamination problems.

Although a preferred embodiment of the present invention has been disclosed above, it will be appreciated that numerous alterations and modifications thereof will no doubt become apparent to those skilled in the art after having read the above disclosures. It is therefore intended that the following claims be interpreted as covering all such alterations and modifications as fall within the true spirit and scope of the invention.

What is claimed is:

1. In a processing system including a pressurized processing chamber into which a substrate with a surface to be processed may be disposed, means for heating/cooling the opposite surface of said substrate including a heat exchanger disposed immediately adjacent said opposite surface, and means for directing a flow of gas between said heat exchanger and said opposite surface, said means for directing of flow of as including a source of said gas, means forming a primary path for said gas from said source to said substrate, and first valve means for controlling the flow of said gas through said primary path, an improved means for heating/cooling said substrate, comprising:

means communicating with said primary path and forming a secondary path for said gas from said primary path to said processing chamber; and second valve means disposed in said secondary path and operatively associated with said first valve means such that when said first valve means is open, said second valve means is closed and said gas flows from said source through said primary path means to said substrate, and when first valve means is closed said second valve means is open allowing gas contained in said primary path means downstream of said first valve means to flow through said secondary path means into said processing chamber.

2. In a processing system as recited in claim 1, wherein said first and second valve means are embodied in a single structure operative in two states such that in one state said gas is isolated from said secondary path means and flows from said source through said primary path means to said substrate and in the other state said gas flows from said primary path means downstream of said single structure through said secondary path means into said processing chamber.

3. A means for heating/cooling the backside of a semiconductive wafer during processing of the front side thereof in a processing chamber comprising:

means for heating/cooling the backside of the wafer including a heating/cooling plate disposed immediately adjacent the backside of the wafer;

means for directing a flow of gas between said plate and said wafer to improve the thermal transfer therebetween, said means for directing a flow of gas including:

a source of said gas, means forming a primary path for said gas from said source to said wafer, first valve means for controlling the flow of said gas through said primary path;

means communicating with said first path and forming a secondary path for said gas from a point downstream of said first valve means to said processing chamber; and second valve means in said secondary path and operatively associated with said first valve means such that, when said first valve means is opened said second valve means is closed, said gas flows from said source through said primary path to said wafer, and when said first valve means is closed said second valve means is opened and gas contained in said primary path downstream of said first valve means is allowed to flow through said secondary path means into said processing chamber.

4. A means for heating/cooling the backside of a semiconductor wafer as recited in claim 3 wherein said first and second valve means are embodied in a single structure operative in two states such that in one state said gas is isolated from said secondary path and flows from said source through said primary path to said wafer, and in the other state said gas flows from said primary path downstream of said single structure through said secondary path into said processing chamber.

* * * * *